(12) United States Patent
Lee et al.

(10) Patent No.: US 8,603,851 B2
(45) Date of Patent: Dec. 10, 2013

(54) SOLAR CELL AND METHOD OF MANUFACTURING THE SAME BY SIMULTANEOUSLY FORMING FIRST AND SECOND DOPING REGIONS

(75) Inventors: Sungeun Lee, Seoul (KR); Youngho Choe, Seoul (KR)

(73) Assignee: LG Electronics Inc., Seoul (KR)

( * ) Notice: Subject to any disclaimer, the term of this patent is extended or adjusted under 35 U.S.C. 154(b) by 747 days.

(21) Appl. No.: 12/638,620

(22) Filed: Dec. 15, 2009

(65) Prior Publication Data
US 2010/0147378 A1 Jun. 17, 2010

(30) Foreign Application Priority Data
Dec. 15, 2008 (KR) .................... 10-2008-0127323

(51) Int. Cl.
*H01L 21/00* (2006.01)
(52) U.S. Cl.
USPC ............................................. 438/71; 438/98
(58) Field of Classification Search
USPC ...................................................... 438/71, 98
See application file for complete search history.

(56) References Cited

U.S. PATENT DOCUMENTS

| | | | | |
|---|---|---|---|---|
| 4,478,879 A * | 10/1984 | Baraona et al. | ............... | 438/57 |
| 4,927,770 A * | 5/1990 | Swanson | .................. | 438/83 |
| 6,695,903 B1 * | 2/2004 | Kubelbeck et al. | ...... | 106/287.14 |
| 7,135,350 B1 * | 11/2006 | Smith et al. | ............... | 438/48 |
| 7,339,110 B1 * | 3/2008 | Mulligan et al. | ............ | 136/256 |
| 2008/0295887 A1 * | 12/2008 | Moslehi | ................... | 136/259 |
| 2009/0095344 A1 | 4/2009 | Machida et al. | | |
| 2009/0305456 A1 | 12/2009 | Funakoshi | | |

FOREIGN PATENT DOCUMENTS

| | | |
|---|---|---|
| JP | 2005-5352 A | 1/2005 |
| JP | 2005-333016 A | 12/2005 |
| JP | 2007-88254 A | 4/2007 |
| JP | 2007-294677 A | 11/2007 |
| KR | 10-0697439 A | 12/2001 |

* cited by examiner

*Primary Examiner* — Kimberly Rizkallah
*Assistant Examiner* — Alexander Belousov
(74) *Attorney, Agent, or Firm* — Birch, Stewart, Kolasch & Birch, LLP

(57) ABSTRACT

A solar cell and a method of manufacturing the same are disclosed. The method includes simultaneously forming a first doping region of a first conductive type and a second doping region of a second conductive type opposite the first conductive type into a substrate of the first conductive type, forming a back passivation layer on the first doping region and the second doping region, removing portions of the back passivation layer to expose a portion of the first doping region and a portion of the second doping region, and forming a first electrode and a second electrode that are connected to the exposed portion of the first doping region and the exposed portion of the second doping region, respectively.

18 Claims, 5 Drawing Sheets

SOLAR CELL AND METHOD OF MANUFACTURING THE SAME BY SIMULTANEOUSLY FORMING FIRST AND SECOND DOPING REGIONS

This application claims priority to and the benefit of Korean Patent Application No. 10-2008-0127323 filed in the Korean Intellectual Property Office on Dec. 15, 2008, the entire contents of which are incorporated herein by reference.

BACKGROUND OF THE INVENTION

1. Field of the Invention

Embodiments of the invention relate to a solar cell and a method of manufacturing the same.

2. Description of the Related Art

Recently, as existing energy sources such as petroleum and coal are expected to be depleted, interests in alternative energy sources for replacing the existing energy sources are increasing. Among the alternative energy sources, solar cells generating electric energy from solar energy have been particularly spotlighted.

A solar cell generally includes a substrate and an emitter layer, each of which is formed of a semiconductor, and a plurality of electrodes respectively formed on the substrate and the emitter layer. The semiconductors forming the substrate and the emitter layer have different conductive types, such as a p-type and an n-type. A p-n junction is formed at an interface between the substrate and the emitter layer. When light is incident on the solar cell, a plurality of electron-hole pairs are generated in the semiconductors. The electron-hole pairs are separated into electrons and holes by the photovoltaic effect. Thus, the separated electrons move to the n-type semiconductor (e.g., the emitter layer) and the separated holes move to the p-type semiconductor (e.g., the substrate). The electrons and holes are respectively collected by the electrodes electrically connected to the emitter layer and the electrodes electrically connected to the substrate. The electrodes are connected to one another using electric wires to thereby obtain electric power.

In the solar cell, the plurality of electrodes electrically connected to the emitter layer are positioned on the emitter layer, and the plurality of electrodes electrically connected to the substrate are positioned on the substrate. Thus, the electrons and the holes collected by the electrodes of the emitter layer and the substrate move to a load connected to the outside.

However, in this case, because the electrodes are formed on the emitter layer on an incident surface of the substrate, on which light is incident, as well as a non-incident surface of the substrate, on which light is not incident, an incident area of light decreases. Hence, efficiency of the solar cell is reduced.

Accordingly, a back contact solar cell, in which all of electrodes collecting electrons and holes are formed on a back surface of a substrate, was developed so as to increase the incident area of light.

SUMMARY OF THE INVENTION

In one aspect, there is a method of manufacturing a solar cell including simultaneously forming a first doping region of a first conductive type and a second doping region of a second conductive type opposite the first conductive type into a substrate of the first conductive type, forming a back passivation layer on the first doping region and the second doping region, removing portions of the back passivation layer to expose a portion of the first doping region and a portion of the second doping region, and forming a first electrode and a second electrode that are connected to the exposed portion of the first doping region and the exposed portion of the second doping region, respectively.

The simultaneously forming of the first and second doping regions may include forming a first layer containing first impurities of the second conductive type on a portion of the substrate, forming a second layer containing second impurities of the first conductive type on the first layer and an exposed portion of the substrate, and performing a thermal process on the first layer and the second layer to respectively form the second doping region doped with the first impurities and the first doping region doped with the second impurities into the substrate.

The forming of the first layer may include coating an impurity paste containing the first impurities on the portion of the substrate and then drying the impurity paste. The impurity paste may be coated on the portion of the substrate using a screen printing method or a direct printing method. The forming of the second layer may include spin-coating a solution containing the second impurities on the first layer and the exposed portion of the substrate and then drying the solution.

The simultaneously forming of the first and second doping regions may include forming a layer containing first impurities of the second conductive type on a portion of the substrate, and performing a thermal process on the layer and an exposed portion of the substrate in an atmosphere of second impurities of the first conductive type to form the second doping region doped with the first impurities and the first doping region doped with the second impurities.

The forming of the layer may include coating an impurity paste containing the first impurities on the portion of the substrate and then drying the impurity paste. The impurity paste may be coated on the portion of the substrate using a screen printing method or a direct printing method.

The first conductive type may be an n-type, and the second conductive type may be a p-type.

The exposing portions of the first and second doping regions may include coating an etching paste on portions of the back passivation layer and then drying the etching paste, performing a thermal process on the substrate on which the etching paste is coated, and removing the etching paste. The etching paste may contain at least one of phosphoric acid and hydrofluoric acid.

The forming of the first and second electrodes may include coating a conductive metal paste on the exposed portion of the first doping region and the exposed portion of the second doping region, and drying the conductive metal paste to simultaneously form the first electrode and the second electrode that are connected to the exposed portion of the first doping region and the exposed portion of the second doping region, respectively.

The conductive metal paste may contain silver (Ag) and aluminum (Al). An aluminum content percentage based on total weight of silver (Ag) and aluminum (Al) may be approximately 0.5% to 5%.

The method may further include texturing a surface of the substrate using the back passivation layer as a mask to mask another surface of the substrate to form a textured surface at the surface of the substrate.

The method may further include forming a front passivation layer on the textured surface of the substrate corresponding to a light incident surface of the substrate. The front passivation layer may contain first conductive type impurities.

A concentration of the first conductive type impurities contained in the front passivation layer may be greater than a concentration of first conductive type impurities contained in the substrate.

The method may further include forming an anti-reflection layer on a light incident surface of the substrate.

In another aspect, there is a solar cell having a back contact structure including a first doping region of a first conductive type positioned into a substrate of the first conductive type, a second doping region of a second conductive type opposite the first conductive type positioned into the substrate, a back passivation layer positioned on the first doping region and the second doping region, the back passivation layer exposing a portion of the first doping region and a portion of the second doping region, a first electrode connected to the exposed portion of the first doping region, and a second electrode connected to the exposed portion of the second doping region, wherein the first and second electrodes are formed of the same material.

Each of the first and second electrodes may contain silver (Ag) and at least one conductive material. The at least one conductive material may include at least one selected from the group consisting of nickel (Ni), copper (Cu), aluminum (Al), tin (Sn), zinc (Zn), indium (In), titanium (Ti), gold (Au), and a combination thereof.

A content percentage of the at least one conductive material based on a sum of a content of the silver and a content of the at least one conductive material may be approximately 0.5% to 5%.

The solar cell may further include a front passivation layer positioned on a light incident surface of the substrate. The front passivation layer may contain impurities of the first conductive type.

The solar cell may further include an anti-reflection layer positioned on the light incident surface of the substrate. The anti-reflection layer may be positioned on the front passivation layer.

The substrate may have a textured surface on a light incident surface of the substrate.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

The invention will be described more fully hereinafter with reference to the accompanying drawings, in which example embodiments of the inventions are shown. This invention may, however, be embodied in many different forms and should not be construed as limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Reference will now be made in detail to embodiments of the invention, examples of which are illustrated in the accompanying drawings.

Figure 1:
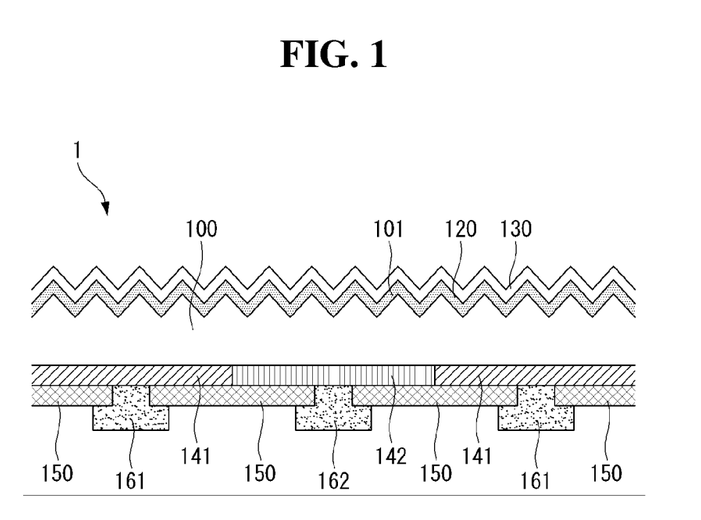
FIG. 1 is a partial cross-sectional view of a solar cell according to an embodiment of the invention.

FIG. 1 is a partial cross-sectional view of a solar cell according to an embodiment of the invention.

As shown in FIG. 1, a solar cell 1 according to an embodiment of the invention includes a substrate 100, a front passivation layer 120 positioned into a surface (hereinafter, referred to as "a front surface") of the substrate 100 on which light is incident, an anti-reflection layer 130 on the front passivation layer 120, a plurality of first doping regions 141 into a surface (hereinafter, referred to as "a back surface") of the substrate 100, opposite the front surface of the substrate 100, on which the light is not incident, a plurality of second doping regions 142 positioned adjacent to the first doping regions 141 into the back surface of the substrate 100, a back passivation layer 150 positioned on portions of the first doping regions 141 and portions of the second doping regions 142, a plurality of electrodes 161 (hereinafter, referred to as "first electrodes") for electrons, and connected to exposed portions of the first doping regions 141, and a plurality of electrodes 162 (hereinafter, referred to as "second electrodes") for holes, and connected to exposed portions of the second doping regions 142.

The substrate 100 is a semiconductor substrate formed of first conductive type silicon, for example, n-type silicon, though not required. Examples of silicon include crystalline silicon, such as single crystal silicon and polycrystalline silicon, and amorphous silicon. If the substrate 100 is of the n-type, the substrate 100 may contain impurities of a group V element such as phosphorus (P), arsenic (As), and antimony (Sb). Alternatively, the substrate 100 may be of a p-type. If the substrate 100 is of the p-type, the substrate 100 may contain impurities of a group III element such as boron (B), gallium (Ga), and indium (In). In addition, the substrate 100 may be formed of semiconductor materials other than silicon.

The front surface of the substrate 100 is textured to form a textured surface corresponding to an uneven surface (raised and lowered portions) having a plurality of uneven portions 101. Hence, light reflectance of the front surface of the substrate 100 is reduced to about 11%. Further, because a light incident operation and a light reflection operation are many times performed on the textured surface of the substrate 100, the light is confined in the solar cell 1. Hence, a light absorption increases and the efficiency of the solar cell 1 is improved.

The uneven portions 101 may have a non-uniform pyramid structure (or pyramid-like structure), and a height of each of the uneven portions 101 may be approximately 1 µm to 10 µm.

The front passivation layer 120 into the front surface of the substrate 100 corresponding to the textured surface is an impurity region (e.g., an n+-type region) that is more heavily doped with impurities (e.g., n-type impurities) of the same conductive type as the substrate 100 than the substrate 100. The front passivation layer 120 serves as a front surface field (FSF) layer similar to a back surface field (BSF) layer. In other words, the movement of holes to the front passivation layer 120 is prevented by a potential barrier resulting from a difference between impurity doping concentrations of the substrate 100 and the front passivation layer 120. Thus, a recombination and/or a disappearance of electrons and holes around the front surface of the substrate 100 are prevented or reduced.

The anti-reflection layer 130 on the front passivation layer 120 is formed of silicon nitride (SiNx) and/or silicon oxide ($SiO_x$). The anti-reflection layer 130 reduces a reflectance of light incident on the substrate 100 and increases a selectivity of a predetermined wavelength band to thereby increase the efficiency of the solar cell 1. The anti-reflection layer 130 may have a thickness of about 70 nm to 80 nm. The anti-reflection layer 130 has a single-layered structure in the embodiment of the invention, but may have a multi-layered structure such as a double-layered structure. The anti-reflection layer 130 may be omitted, if desired.

The first doping regions 141 and the second doping regions 142 are alternately positioned into the back surface of the substrate 100 and extend substantially parallel to each other.

Each of the plurality of first doping regions 141 is an impurity region (e.g., an n+-type region) that is more heavily doped with impurities (e.g., n-type impurities) of the same conductive type as the substrate 100 than the substrate 100 in the same manner as the front passivation layer 120. The first doping regions 141 serve as back surface field layers. In other words, the movement of holes to the first electrodes 161 is prevented or reduced by a potential barrier resulting from a difference between impurity doping concentrations of the substrate 100 and the first doping regions 141. Thus, a recombination and/or a disappearance of electrons and holes around the first electrodes 161 are prevented or reduced.

Each of the plurality of second doping regions 142 is a heavily doped region doped with impurities (e.g., p-type impurities) of a conductive type opposite a conductive type of the substrate 100. The second doping regions 142 serve as emitter layers, and thus the substrate 100 and the second doping regions 142 form a p-n junction. A plurality of electron-hole pairs produced by light incident on the substrate 100 are separated into electrons and holes by a built-in potential difference resulting from the p-n junction between the substrate 100 and the second doping regions 142. Then, the separated electrons move to the n-type semiconductor, and the separated holes move to the p-type semiconductor. Thus, when the substrate 100 is of the n-type and the second doping regions 142 are of the p-type in the embodiment of the invention, the separated holes and the separated electrons move to the second doping regions 142 and the first doping regions 141, respectively.

Because the substrate 100 and the second doping regions 142 form the p-n junction, the second doping regions 142 may be of the n-type when the substrate 100 is of the p-type, unlike the embodiment of the invention described above. In this case, the separated electrons and the separated holes move to the second doping regions 142 and the first doping regions 141, respectively.

As described above, the electrons and the holes respectively move to the first doping regions 141 and the second doping regions 142 used as a moving path of carriers such as electrons and holes, and then are respectively transferred to the first electrodes 161 and the second electrodes 162.

The back passivation layer 150 on the first and second doping regions 141 and 142 are formed of silicon nitride (SiNx), silicon oxide ($SiO_x$), or a combination thereof and may have a thickness equal to or greater than about 300 nm. The back passivation layer 150 convert defects, such as a dangling bond, existing around the surface of the substrate 100 into stable bonds to thereby prevent or reduce a recombination and/or a disappearance of carriers moving to the back surface of the substrate 100. Further, the back passivation layer 150 again reflects light passing through the substrate 100 on to the substrate 100 to thereby reduce a loss of light incident on the substrate 100.

The back passivation layer 150 has a single-layered structure in the embodiment of the invention, but may have a multi-layered structure, such as a double-layered structure and a triple-layered structure.

The plurality of first electrodes 161 are positioned on exposed portions of the first doping regions 141, that are not covered by the back passivation layer 150, and portions of the back passivation layer 150 adjacent to the exposed portions of the first doping regions 141. The first electrodes 161 extend substantially parallel to one another and are electrically and physically connected to the first doping regions 141. Each of the first electrodes 161 collects carriers (e.g., electrons) moving to each of the first doping regions 141.

The plurality of second electrodes 162 are positioned on exposed portions of the second doping regions 142, that are not covered by the back passivation layer 150, and portions of the back passivation layer 150 adjacent to the exposed portions of the second doping regions 142. The second electrodes 162 are spaced apart from the first electrodes 161 and extend substantially parallel to the first electrodes 161. The second electrodes 162 are electrically and physically connected to the second doping regions 142. Each of the second electrodes 162 collects carriers (e.g., holes) moving to each of the second doping regions 142.

As described above, because portions of each of the first and second electrodes 161 and 162 overlap portions of the back passivation layer 150, each of the first and second electrodes 161 and 162 has an end portion (a portion over the back passivation layer 150) whose the size is greater than other portions (a portion formed or squeezed in between adjacent portions of back passivation layer 150) of each of the first and second electrodes 161 and 162. Hence, when the solar cell 1 is connected to an external driving circuit, etc., a contact resistance of the solar cell 1 is reduced and contact efficiency of the solar cell 1 increases.

The first and second electrodes 161 and 162 are formed of at least one conductive metal material. Examples of the conductive metal material include at least one selected from the group consisting of nickel (Ni), copper (Cu), aluminum (Al), tin (Sn), zinc (Zn), indium (In), titanium (Ti), gold (Au), and a combination thereof. Other conductive metal materials may be used. For example, each of the first and second electrodes 161 and 162 may be formed using a conductive metal paste obtained by adding a conductive metal material, such as aluminum (Al), to silver (Ag). In this case, a content percentage of the conductive metal material based on total weight of silver (Ag) and the conductive metal material may be approximately 0.5% to 5%.

The solar cell 1 according to the embodiment of the invention having the above-described structure is a back contact solar cell in which the first electrodes 161 and the second electrodes 162 are positioned on the back surface of the substrate 100 on which light is not incident. An operation of the back contact solar cell 1 is described below.

When light irradiated to the solar cell 1 is incident on the substrate 100 through the anti-reflection layer 130 and the front passivation layer 120, a plurality of electron-hole pairs are generated in the substrate 100 by light energy based on the incident light. Because the front surface of the substrate 100 is the textured surface, a light reflectance in the front surface of the substrate 100 is reduced. Further, because both a light incident operation and a light reflection operation are performed on the textured surface of the substrate 100, light absorption increases and the efficiency of the solar cell 1 is improved. In addition, because a reflection loss of the light incident on the substrate 100 is reduced by the anti-reflection layer 130, an amount of light incident on the substrate 100 further increases.

The electron-hole pairs are separated from one another by the p-n junction of the substrate 100 and the second doping regions 142, and the separated electrons move to the n-type first doping regions 141 and the separated holes move to the p-type second doping regions 142. The electrons moving to the n-type first doping regions 141 are collected by the first electrodes 161, and the holes moving to the p-type second doping regions 142 are collected by the second electrodes 162. When the first electrodes 161 are connected to the second electrodes 162 using electric wires, current flows therein to thereby enable use of the current for electric power.

In the embodiment of the invention, because the front passivation layer 120 serving as the front surface field layer is positioned on the front surface of the substrate 100 and the first doping regions 141 serving as the back surface field layer are positioned on the back surface of the substrate 100, a recombination and/or a disappearance of electrons and holes in the surfaces of the substrate 100 is reduced. Hence, the efficiency of the solar cell 1 is improved.

A method of manufacturing the solar cell according to the embodiment of the invention is described below with reference to FIGS. 2A to 2J and FIG. 3.

FIGS. 2A to 2J are cross-sectional views sequentially illustrating each of stages in a method of manufacturing the solar cell according to the embodiment of the invention. FIG. 3 partially illustrates another method of manufacturing the solar cell according to the embodiment of the invention.

Figure 2A:
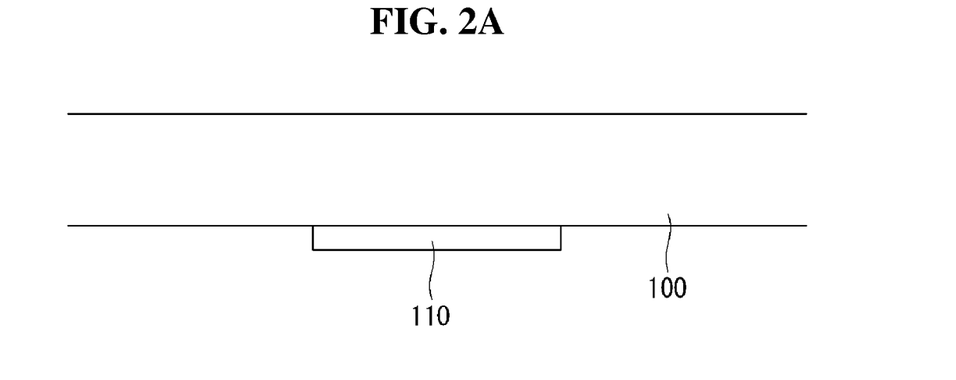
FIGS. 2A to 2J are cross-sectional views sequentially illustrating each of stages in a method of manufacturing a solar cell according to an embodiment of the invention.
Figure 3:
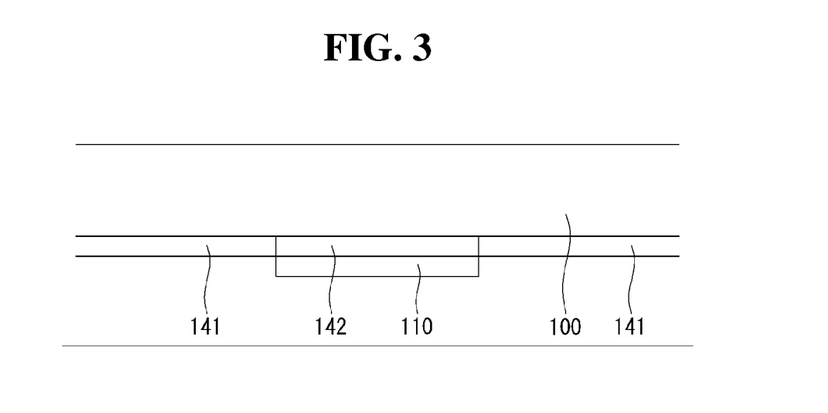
FIG. 3 partially illustrates another method of manufacturing a solar cell according to an embodiment of the invention.

First, as shown in FIG. 2A, a doping and shielding paste 110 as an impurity paste containing group III element impurities, for example, boron (B) is selectively coated on the substrate 100 formed of n-type single crystal silicon and then is cured through a thermal process. The doping and shielding paste 110 is coated on a portion to form a heavily doped p-type region.

The doping and shielding paste 110 is coated through a screen printing method using a screen mask having a predetermined pattern in the embodiment of the invention, but may be coated on a desired portion using other methods such as a sputtering method and a direct printing method not using a screen mask. Further, the doping and shielding paste 110 contains boron (B) as a dopant in the embodiment of the invention, but may contain other group III elements, such as gallium (Ga) and indium (In), as a dopant.

The doping and shielding paste 110 may be cured through a rapid thermal process (RTP) performed at about 300° C. to 700° C. or a hotplate method for about 3 to 5 minutes. Other methods for curing the doping and shielding paste 110 may be used.

Figure 2B:
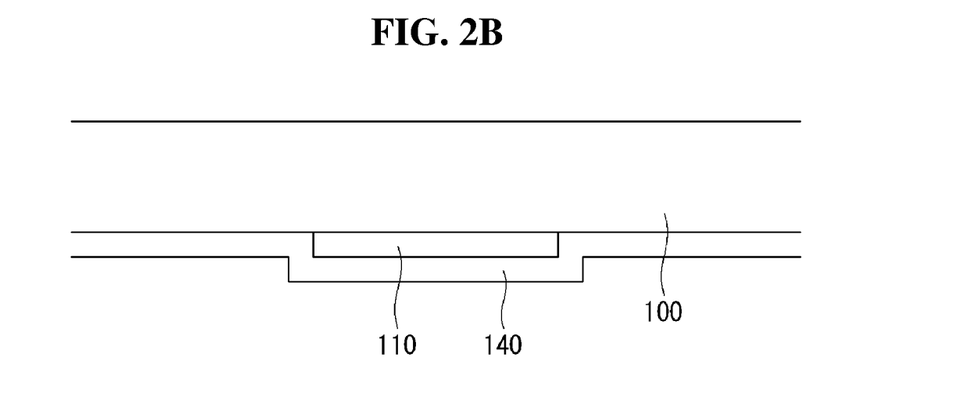

Next, as shown in FIG. 2B, a superoxide dismutase (SOD) solution doped with a group V element, for example, phosphorus (P) is spin-coated on the surface of the substrate 100, on which the doping and shielding paste 110 is formed, and then is dried to form a phosphorus-doped layer 140.

Figure 2C:
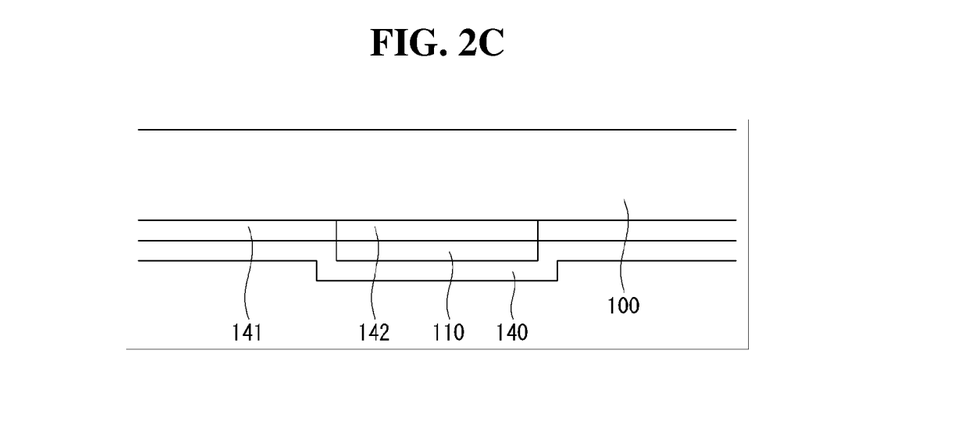

Next, as shown in FIG. 2C, a thermal process is performed on the substrate 100 using a diffusion furnace preheated to about 850° C. Hence, phosphorus contained in the phosphorus-doped layer 140 and boron contained in the doping and shielding paste 110 are diffused into the substrate 100 to simultaneously form heavily doped n-type regions (i.e., first doping regions 141) and heavily doped p-type regions (i.e., second doping region 142s) into the substrate 100. More specifically, phosphorus contained in the phosphorus-doped layer 140 is diffused into the substrate 100 underlying the phosphorus-doped layer 140 to form the first doping region 141, and boron contained in the doping and shielding paste 110 is diffused into the substrate 100 underlying the doping and shielding paste 110 serving as a boron-doped barrier paste to form the second doping region 142.

A sheet resistance and a junction depth of the first doping region 141 thus formed are about 15 Ω/sq and about 0.5 μm, respectively. A sheet resistance and a junction depth of the second doping region 142 thus formed are about 50 Ω/sq and about 0.7 μm, respectively.

On the other hand, as shown in FIG. 3, the doping and shielding paste 110 is coated on the substrate 100 in the same manner as FIG. 2A, and then the substrate 100 is thermally processed in a thermal diffusion room of $POCl_3$ gas atmosphere. Hence, phosphorus contained in the $POCl_3$ gas and boron contained in the doping and shielding paste 110 are diffused into the substrate 100 to simultaneously form heavily doped n-type regions (i.e., first doping regions 141) and heavily doped p-type regions (i.e., second doping regions 142) on the substrate 100.

Figure 2D:
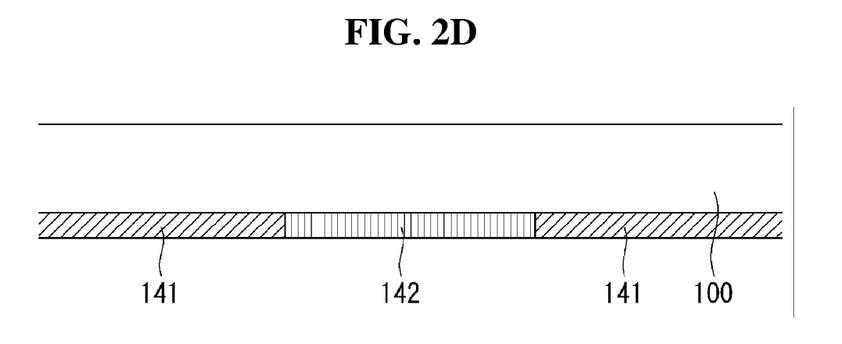

As above, when p-type impurities and n-type impurities are diffused into the substrate 100 as shown in FIGS. 2C and 3, boron silicate glass (BSG) and phosphorous silicate glass (PSG) are produced in the doping and shielding paste 110 and the phosphorus-doped layer 140 or in the doping and shielding paste 110 and the surface of the substrate 100. Thus, BSG and PSG are removed through an etching process. As a result, the doping and shielding paste 110 and the phosphorus-doped layer 140 are removed as shown in FIG. 2D. BSG and PSG may be removed using about 10% hydrofluoric acid.

Unlike the embodiment of the invention, the first doping regions 141 may be formed by diffusing impurities of a group V element, such as arsenic (As) and antimony (Sb), instead of phosphorus into the substrate 100. Further, the second region 142 may be formed by diffusing impurities of a group III element, such as gallium (Ga) and indium (In), instead of boron into the substrate 100.

Because the first doping regions 141 serving as the back surface field layer and the second regions 142 serving as the emitter portions for the p-n junction are simultaneously formed through only one process in the embodiment of the invention, the number of manufacturing processes and manufacturing time are reduced.

Unlike the embodiment of the invention, if the substrate 100 is formed of p-type silicon, the first and second doping regions 141 and 142 may be formed using a paste containing a group V element, such as phosphorus, instead of boron-containing paste and a SOD solution doped with a group III element, such as boron, through the processes illustrated in FIGS. 2A to 2D.

The properties, such as the sheet resistance and the junction depth, of each of the first and second doping regions 141 and 142 vary depending on process conditions such as a resistance of the substrate 100, a diffusion temperature, and process time. Thus, the process conditions are optimized, so that each of the first and second doping regions 141 and 142 has the optimum properties.

Before the doping and shielding paste 110 is coated on the substrate 100, a saw damage removal process, a process for forming the uneven portions, a cleaning process, etc., are performed on the surface of the substrate 100 to improve the surface state of the substrate 100. Since these processes are well known to those skilled in the art, a further description may be briefly made or may be entirely omitted.

The doping and shielding paste 110 serves as a doping layer for doping a desired portion with corresponding impurities (for example, p-type impurities) and as a shielding layer for preventing impurities (for example, n-type impurities) contained in the phosphorus-doped layer 140 on the doping and shielding paste 110 from being doped in an unwanted portion of the substrate 100.

As described above, because the first doping regions 141 and the second regions 142 are simultaneously formed through only one process through the doping and shielding paste 110 serving as the doping layer and the shielding layer, the number of manufacturing processes and the manufacturing time are reduced.

On the contrary, in the related art, the first doping regions 141 and the second regions 142 were individually formed. More specifically, a method for forming the first and second doping regions 141 and 142 in the related art includes steps of forming a doping prevention layer on a substrate so as to dope impurities by exposing a desired doping region corresponding to one of the first and second doping regions 141 and 142, forming a photosensitive layer on the doping prevention layer, positioning an exposure mask on the photosensitive layer and then performing an exposing process on the photosensitive layer to form a photosensitive pattern corresponding to the desired doping region, removing an exposed portion of the doping prevention layer using the photosensitive pattern as a mask to expose a portion of the substrate corresponding to the desired doping region, removing the photosensitive pattern, doping the exposed portion of the substrate with impurities using the doping prevention layer as a mask, removing the doping prevention layer, and repeatedly performing the above steps for forming the other doping region. In other words, many process steps had to be performed to form the first and second doping regions 141 and 142.

Further, in the steps of performing the exposing process for forming the photosensitive pattern and removing the exposed portion of the doping prevention layer, the photosensitive pattern having a desired shape was not obtained because an amount of light used in exposure of the photosensitive layer and a penetration depth of an etchant varied depending on a location, and thus an unwanted portion was doped with the impurities. However, in the embodiment of the invention, because the doping and shielding paste 110 can be formed in a desired portion, only the desired portion can be doped with impurities.

In the step of removing the doping prevention layer, the exposed surface of the substrate was damaged because of the use of a caustic solution, etc. However, in the embodiment of the invention, the step of removing the doping prevention layer is not necessary.

Furthermore, in the related art, because the first doping regions 141 and the second regions 142 were formed by exposing the substrate at a high temperature and doping the exposed substrate with the impurities, the exposed substrate was damaged. However, in the embodiment of the invention, because the surface of the substrate 100 is protected by the doping and shielding paste 110 and the phosphorus-doped layer 140, a damage of the surface of the substrate 100 by a high temperature in a diffusion process decreases.

Figure 2E:
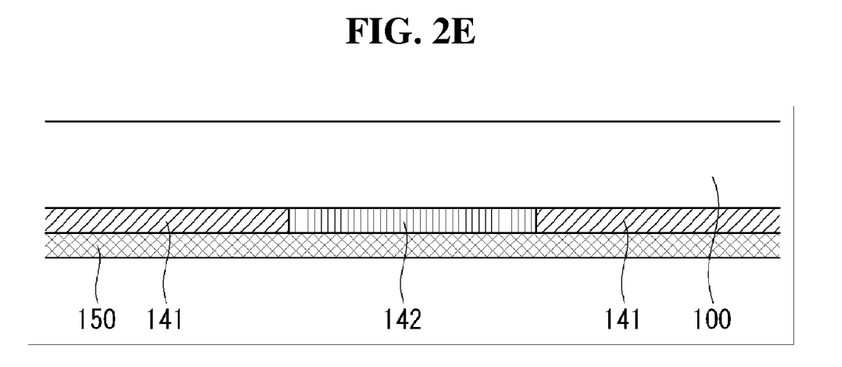

Next, as shown in FIG. 2E, an oxide layer such as silicon oxide ($SiO_x$) is grown at a high temperature to form the back passivation layer 150. A process for forming the back passivation layer 150 may be performed at about 1,000° C., and a thickness of the back passivation layer 150 thus formed may vary depending on a temperature of a growing room, growing time, etc.

When a desired thickness of the back passivation layer 150 is not obtained through the high temperature growth or it is required that characteristics of the oxide layer are prevented from being degraded because of an oxide growth at the high temperature for a long time, silicon oxide ($SiO_x$) may be additionally deposited using a chemical vapor deposition (CVD) method, such as a plasma enhanced CVD (PECVD) method, if necessary.

Unlike the embodiment of the invention, the back passivation layer 150 may be formed using silicon nitride (SiNx). Further, the back passivation layer 150 may be formed using an organic insulating material as well as an inorganic insulating material, such as silicon nitride (SiNx) and silicon oxide ($SiO_x$).

Figure 2F:
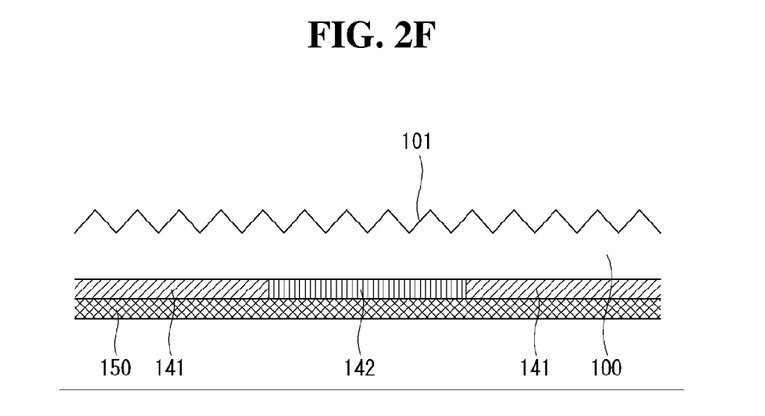

Next, as shown in FIG. 2F, a texturing process is performed on the front surface of the substrate 100, on which the back passivation layer 150 is not formed, using the back passivation layer 150 as a mask to form the textured surface corresponding to the uneven surface having the plurality of uneven portions 101. The texturing process is generally performed by immersing the substrate 100 in a bath filled with an alkali solution for a predetermined time.

For example, the texturing process may be performed in an alkali solution of about 80° C. for about 20 to 40 minutes. When the texturing process is performed, the back surface of the substrate 100 is protected by the back passivation layer 150 and is not etched, and only the front surface of the substrate 100 not having the back passivation layer 150 is etched to form the uneven surface. A reason why the uneven surface is formed through the texturing process is that an etch rate varies depending on a crystal orientation of the substrate 100. In other words, because an etch rate of Si (100) surface is greater than an etch rate of Si (111) surface, the uneven surface is formed. As above, the back passivation layer 150 formed of silicon oxide ($SiO_x$) is not etched by the alkali solution.

Examples of the alkali solution include about 2 to 5 wt % of KOH solution and about 2 to 5 wt % of NaOH solution. Alternatively, $NH_4OH$ solution may be used.

A height of each of the uneven portions 101, i.e., a height of a pyramid structure may be approximately 1 μm to 10 μm.

Because the texturing process is performed on the front surface of the substrate 100 using the back passivation layer 150 as the mask, a separate etch stop layer does not need to be formed. Thus, manufacturing time and the manufacturing cost of the solar cell 1 are reduced.

Figure 2G:
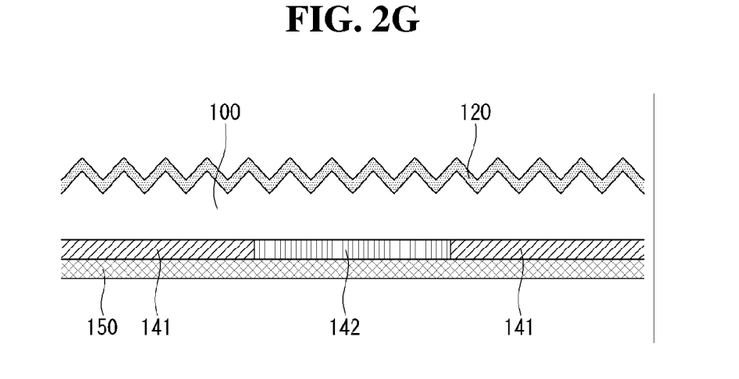

Next, as shown in FIG. 2G, impurities (e.g., n-type impurities) of the same conductive type as the substrate 100 are more heavily doped on the entire textured surface (i.e., the entire front surface) of the substrate 100 than the substrate 100 to form the front passivation layer 120 on the entire front surface of the substrate 100.

The front passivation layer 120 is completed by thermally diffusing the n-type impurities inside a high temperature diffusion furnace into the substrate 100 to form a thin $n^+$-layer. The front passivation layer 120 prevents or reduces a recombination and/or a disappearance of carriers produced in the front surface of the substrate 100 using a difference between impurity doping concentrations of the substrate 100 and the front passivation layer 120, thereby improving the efficiency of the solar cell 1. The front passivation layer 120 has a thickness of about 500 nm. When the front passivation layer 120 is of the n-type, a group V element such as P, As, and Sb is generally used as n-type impurities, and a gas source such as $PH_3$, a liquid source such as $POCl_3$ and $H_3PO_4$, a solid oxide source including $P_2PO_5$ and $P_2PO_7$, etc. may be used as a source of phosphorus (P).

However, unlike the above-described process, the front passivation layer 120 may be stacked on the substrate 100 using a CVD method. In other words, the front passivation layer 120 may be formed as a separate layer.

Figure 2H:
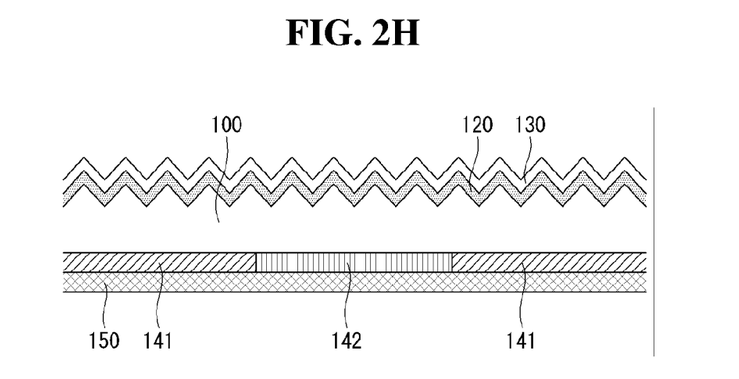

Next, as shown in FIG. 2H, the anti-reflection layer 130 is formed on the front passivation layer 120. The anti-reflection layer 130 may be formed using silicon nitride (SiNx) and/or silicon oxide ($SiO_x$) through a CVD method, such as a PECVD method, or a sputtering method.

Although the anti-reflection layer 130 has a single-layered structure in the embodiment of the invention, the anti-reflection layer 130 may have a multi-layered structure for improving an anti-reflection effect. If the anti-reflection layer 130 includes two layers each different physical properties, a lower layer of the two layers may be formed of a material having a high refractive index of about 2.2 to 2.6 and an upper layer may be formed of a material having a low refractive index of about 1.3 to 1.6.

Figure 2I:
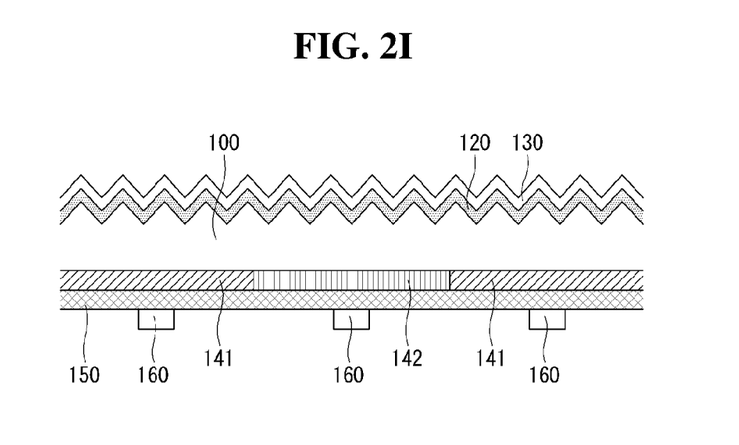

Next, as shown in FIG. 2I, an etching paste 160 is screen-printed on a desired portion of the back passivation layer 150 to form a desired pattern. More specifically, the etching paste 160 is coated on a portion of the back passivation layer 150 corresponding to a portion of each of the first and second doping regions 141 and 142 to form the first and second electrodes 161 and 162. The etching paste 160 may include an etchant such as phosphoric acid and hydrofluoric acid.

Figure 2J:
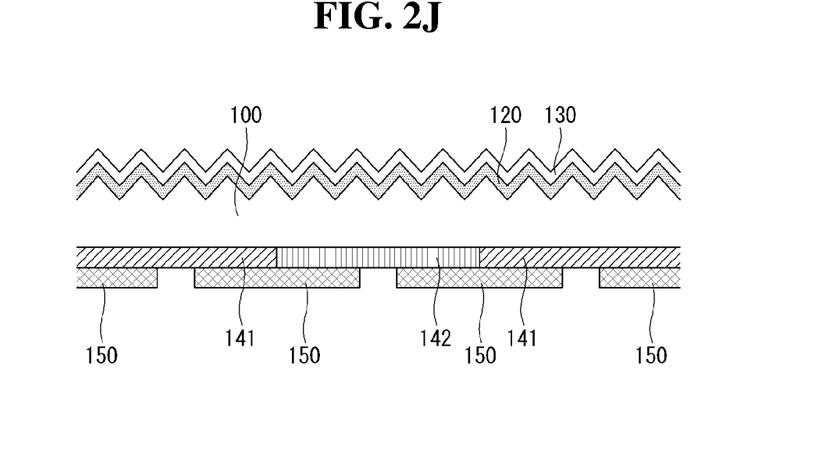

Next, as shown in FIG. 2J, a thermal process is performed on the etching paste 160 under the condition of proper temperature and time, for example, at about 150° C. to 300° C. for about 2 to 5 minutes to etch a portion of the back passivation layer 150 underlying the etching paste 160. Hence, a portion of each of the first and second doping regions 141 and 142 is exposed. In other words, only a portion of the back passivation layer 150, on which the etching paste 160 is coated, is selectively removed. The remaining etching paste 160 is removed using water, etc. If the etching paste 160 remains in the back passivation layer 150 after removing the etching paste 160 using water, the remaining etching paste 160 may be additionally removed using ultrasonic waves. Hence, the portion of the first doping region 141 and the portion of the second doping region 142 are exposed by the back passivation layer 150.

An etching thickness of the back passivation layer 150 etched by the etching paste 160 may be controlled by an amount of acid component contained in the etching paste 160, etc.

An etching process using the etching paste 160 according to the embodiment of the invention has the following advantages, compared with a photolithographic etching process according to the related art.

In the photolithographic etching process according to the related art, a process for coating a photosensitive layer on a back passivation layer, a process for forming a desired photosensitive pattern through an exposure using a mask, a process for etching a desired portion of the back passivation layer using the photosensitive pattern as a mask, and a process for removing the photosensitive pattern are necessary. Further, when a dry or wet etching process is used to etch the desired portion of the back passivation layer, a process for forming an etch stop layer in a portion of the back passivation layer, on which the etching process does not have to be performed, a process for performing the etching process using an etchant, a process for removing the etch stop layer after performing the etching process are necessary.

However, in the etching process according to the embodiment of the invention, a process for directly coating the etching paste on a desired portion, a process for removing a portion underlying the etching paste through a thermal process, and a process for removing the coated etching paste with water are necessary. In other words, the etching process according to the embodiment of the invention is much simpler than the photolithographic etching process according to the related art.

Further, in the photolithographic etching process according to the related art, because an amount of light used in the exposure of the photosensitive layer or a penetration depth of the etchant varies depending on a location, an unwanted portion was removed. Hence, it was difficult to obtain an etch pattern having a desired shape. However, in the etching process according to the embodiment of the invention, because only a portion on which the etching paste 160 is formed is accurately etched, an etch pattern having a desired shape may be easily obtained.

Further, when a caustic solution was used to remove the etch stop layer in the related art, the exposed surface was damaged. However, in the etching process according to the embodiment of the invention, the etching paste 160 may be removed using water, and also the etching paste 160 remaining after removing the etching paste 160 using water may be additionally removed using ultrasonic waves. Thus, a damage of the exposed surface or changes in operation characteristic resulting from the remaining paste is not generated.

Subsequently, a conductive metal paste (i.e., Ag—Al metal paste) containing Al powder and Ag powder is coated on the exposed portion of the first doping portion 141 and the exposed portion of the second doping portion 142 through a screen printing method and then is cured in a heating furnace to form the first and second electrodes 161 and 162. Hence, the solar cell shown in FIG. 1 is completed.

In this case, operation characteristics of the first and second electrodes 161 and 162, in which electrons move to the first electrode 161 because of Ag and holes move to the second electrode 162 because of Al, are obtained by controlling Ag content percentage and Al content percentage in Ag—Al metal powers. The Al content percentage based on total weight of the Ag—Al metal power may be approximately 0.5% to 5%, preferably, approximately 1% to 3%.

Because the conductive metal paste contains the Al powder as well as the Ag powder, contact resistances between the first and second electrodes 161 and 162 and the first and second doping regions 141 and 142 underlying the first and second electrodes 161 and 162 are reduced. In particular, the contact resistance between the second electrodes 162 and the second doping regions 142 is reduced.

In the embodiment of the invention, because a portion of the conductive metal paste is coated on the back passivation layer 150 adjacent to the exposed portion of each of the first and second doping portions 141 and 142, each of the first and second electrodes 161 and 162 has an end portion formed over the back passivation layer 150 whose the size is greater than other portions formed between adjacent portions of back passivation layer 150 of each of the first and second electrodes 161 and 162.

The conductive metal paste for forming the first and second electrodes 161 and 162 may include at least one selected from the group consisting of Ni, Cu, Sn, Zn, In, Ti, Au, and a combination thereof in addition to at least one selected from the group consisting of Al, Ag, and a combination thereof.

As above, because portions of the back passivation layer 150 respectively corresponding to formation locations of the first and second electrodes 161 and 162 are simultaneously etched using the etching paste 160 and also the first and second electrodes 161 and 162 are simultaneously formed using the conductive metal paste containing Ag and Al, the number of manufacturing processes is reduced. As a result, the manufacturing time and the manufacturing cost are reduced.

Furthermore, the etching paste 160 is coated on only the etched portion of the back passivation layer 150 in the embodiment of the invention. However, in the related art, the photosensitive layer is coated on the entire surface of the back passivation layer 150, and then a desired portion has to be removed using the mask. Thus, the coated size of the etching paste 160 is much less than the coated size of the photosensitive layer. As a result, the manufacturing time and the manufacturing cost are further reduced.

Furthermore, because each of the first and second electrodes 161 and 162 contains Ag as well as Al, electrical contact performance and conductivity between each of the first and second electrodes 161 and 162 and an external terminal are improved. Thus, a soldering operation for improving the electrical contact performance is directly performed between each of the first and second electrodes 161 and 162 and the external terminal without coating a separate conductive material, such as Sn, on each of the first and second electrodes 161 and 162. Hence, a module process for fabricating a solar cell module is simple.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of manufacturing a solar cell, the method comprising:
   simultaneously forming a first doping region of a first conductive type and a second doping region of a second conductive type opposite the first conductive type into a substrate, the simultaneously forming comprising forming a first layer containing the second conductive type impurities on a first doping region of the substrate, forming a second layer containing the first conductive type impurities on the first layer and a second doping region of the substrate, and performing one thermal process on the first layer and the second layer;
   forming a back passivation layer on the first doping region and the second doping region;
   removing portions of the back passivation layer to expose a portion of the first doping region and a portion of the second doping region; and
   forming a first electrode and a second electrode that are connected to the exposed portion of the first doping region and the exposed portion of the second doping region, respectively,
   wherein the second doping region is a remnant portion of the substrate excluding the first doping region, such that the first doping region and the second doping region directly contacts one another,
   wherein the first doping region and the second doping region are formed by the one thermal process, and
   wherein the second layer directly contacts the first layer and the second doping region of the substrate.

2. The method of claim 1, wherein the forming of the first layer comprises coating an impurity paste containing the impurities second conductive type on the first doping region of the substrate and then drying the impurity paste.

3. The method of claim 2, wherein the impurity paste is coated on the first doping region of the substrate using a screen printing method or a direct printing method.

4. The method of claim 1, wherein the forming of the second layer comprises spin-coating a solution containing the impurities of the first conductive type on the first layer and the second doping region of the substrate and then drying the solution.

5. The method of claim 1, wherein the simultaneously forming of the first and second doping regions comprises:
   forming a layer containing first impurities of the second conductive type on a portion of the substrate; and
   performing a thermal process on the layer and an exposed portion of the substrate in an atmosphere of second impurities of the first conductive type to form the second doping region doped with the first impurities and the first doping region doped with the second impurities.

6. The method of claim 5, wherein the forming of the layer comprises coating an impurity paste containing the first impurities on the portion of the substrate and then drying the impurity paste.

7. The method of claim 6, wherein the impurity paste is coated on the portion of the substrate using a screen printing method or a direct printing method.

8. The method of claim 1, wherein the first conductive type is an n-type, and the second conductive type is a p-type.

9. The method of claim 1, wherein the exposing portions of the first and second doping regions comprises:
   coating an etching paste on portions of the back passivation layer and then drying the etching paste;
   performing a thermal process on the substrate on which the etching paste is coated; and
   removing the etching paste.

10. The method of claim 9, wherein the etching paste contains at least one of phosphoric acid and hydrofluoric acid.

11. The method of claim 1, wherein the forming of the first and second electrodes comprises:
    coating a conductive metal paste on the exposed portion of the first doping region and the exposed portion of the second doping region; and
    drying the conductive metal paste to simultaneously form the first electrode and the second electrode that are connected to the exposed portion of the first doping region and the exposed portion of the second doping region, respectively.

12. The method of claim 11, wherein the conductive metal paste contains silver (Ag) and aluminum (Al).

13. The method of claim 12, wherein an aluminum content percentage based on total weight of silver (Ag) and aluminum (Al) is approximately 0.5% to 5%.

14. The method of claim 1, further comprising texturing a surface of the substrate using the back passivation layer as a mask to mask another surface of the substrate to form a textured surface at the surface of the substrate.

15. The method of claim 14, further comprising forming a front passivation layer on the textured surface of the substrate corresponding to a light incident surface of the substrate.

16. The method of claim 15, wherein the front passivation layer contains first conductive type impurities.

17. The method of claim 16, wherein a concentration of the first conductive type impurities contained in the front passivation layer is greater than a concentration of first conductive type impurities contained in the substrate.

18. The method of claim 1, further comprising forming an anti-reflection layer on a light incident surface of the substrate.

\* \* \* \* \*